United States Patent
Park et al.

(10) Patent No.: US 7,691,441 B2
(45) Date of Patent: Apr. 6, 2010

(54) METHOD OF FORMING CARBON FIBERS USING METAL-ORGANIC CHEMICAL VAPOR DEPOSITION

(75) Inventors: Sung-ho Park, Yongin-si (KR); Myoung-jae Lee, Suwon-si (KR); June-mo Koo, Seoul (KR); Bum-seok Seo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 841 days.

(21) Appl. No.: 11/550,121

(22) Filed: Oct. 17, 2006

(65) Prior Publication Data

US 2007/0148451 A1 Jun. 28, 2007

(30) Foreign Application Priority Data

Dec. 28, 2005 (KR) .................. 10-2005-0131879

(51) Int. Cl.
*C23C 16/00* (2006.01)
(52) U.S. Cl. .................. 427/248.1; 427/249.1
(58) Field of Classification Search .................. None
See application file for complete search history.

(56) References Cited

U.S. PATENT DOCUMENTS

| 5,973,444 | A | * | 10/1999 | Xu et al. .................. 313/309 |
| 6,648,712 | B2 | * | 11/2003 | Choi et al. .................. 445/51 |
| 7,189,455 | B2 | * | 3/2007 | Wong et al. .................. 428/408 |
| 2004/0149209 | A1 | | 8/2004 | Dai et al. |
| 2006/0192475 | A1 | * | 8/2006 | Lee et al. .................. 313/495 |

FOREIGN PATENT DOCUMENTS

CN 1493721 A 5/2004
WO 03002789 A1 9/2003

OTHER PUBLICATIONS

Barnard, et al. The Chemistry of Platinum Metals, 1999, Platinum Metals Rev., 43(4), pp. 158-165.*
Office Action issued by the Chinese Patent Office on Mar. 6, 2009 (with English Translation).
European Search Report, 06118906.4-1217, Jun. 6, 2006.
Liming Dai, Department of Polymer Engineering, College of Polymer Science and Polymer Enigineering, The University of Akron Light-emitting polymers and carbon nanotube electron emitters for optoelectronic displays, Smart Materials and Structures, Sep. 13, 2005, pp. 645-651, Institute of Physics Publishing, Akron, OH, XP-020071656.
Rahul Sen, A. Govindaraj, C.N.R. Rao, CSIR Centre of Excellence in Chemistry and Materials Research Centre, Indian Institute of Science, Carbon nanotubes by the metallocene route, Chemical Physics Letters, Elsevier, Mar. 21, 1997, pp. 276-280, Bangalore, India, XP002937692.

* cited by examiner

*Primary Examiner*—Timothy Meeks
*Assistant Examiner*—Kelly M Gambetta
(74) *Attorney, Agent, or Firm*—Cantor Colburn LLP

(57) ABSTRACT

A method of forming carbon fibers at a low temperature below 450° C. using an organic-metal evaporation method is provided. The method includes: heating a substrate and maintaining the substrate at a temperature of 200 to 450° C. after loading the substrate into a reaction chamber; preparing an organic-metal compound containing Ni; forming an organic-metal compound vapor by vaporizing the organic-metal compound; and forming carbon fibers on the substrate by facilitating a chemical reaction between the organic-metal compound vapor and a reaction gas containing ozone in the reaction chamber.

16 Claims, 8 Drawing Sheets

METHOD OF FORMING CARBON FIBERS USING METAL-ORGANIC CHEMICAL VAPOR DEPOSITION

CROSS-REFERENCE TO RELATED PATENT APPLICATION

This application claims priority to Korean Patent Application No. 10-2005-0131879, filed on Dec. 28, 2005, and all the benefits accruing therefrom under 35 U.S.C. §119(a), the contents of which are herein incorporated by reference in its entirety.

BACKGROUND OF THE INVENTION

1. Field of the Invention

The present invention relates to a method of forming carbon fibers using a metal-organic chemical vapor deposition method, and more particularly, to a method of forming carbon fibers at a low temperature below 450° C. using a metal-organic chemical vapor deposition method.

2. Description of the Related Art

A great deal of research has gone into the application of carbon nanotubes or carbon fibers to field emission devices ("FEDs"), fuel cells, semiconductor devices, and the like, since the discovery of the superior structural and electrical characteristics of carbon nanotubes and carbon fibers. Particularly, carbon fibers provide many advantages when used as emitters of FEDs, such as low driving voltage, high brightness, and competitive prices. Conventional methods of forming carbon fibers include arc discharge, laser ablation, chemical vapor deposition ("CVD"), and plasma enhanced chemical vapor deposition ("PECVD"). However, when forming carbon fibers using these methods, a high temperature of greater than 800° C. is required, which can adversely affect the potential fabrication of devices that may be envisioned using carbon nanotube technology. A catalyst material or a plasma process can be used to form carbon fibers at a relatively low temperature. However, these processes still require a relatively high temperature greater than 600° C. Therefore, there is a limit to the reduction of the process temperature for forming carbon fibers when using these processes. Accordingly, there is a need for a method of forming carbon fibers at a low temperature.

BRIEF SUMMARY OF THE INVENTION

The present invention provides a method of forming carbon fibers at a low temperature below 450° C. using a metal-organic chemical vapor deposition method.

According to an embodiment of the present invention, a method of forming carbon fibers comprises: heating a substrate and maintaining the substrate at a temperature of 200 to 450° C. after loading the substrate in a reaction chamber; preparing an organic-metal compound containing Ni; forming an organic-metal compound vapor by vaporizing the organic-metal compound; and forming carbon fibers on the substrate by facilitating a chemical reaction between the organic-metal compound vapor and a reaction gas containing ozone in the reaction chamber.

According to another embodiment of the present invention, a method of manufacturing a field emission device comprises: providing a substrate; sequentially forming a stacked structure comprising a cathode disposed on a surface of the substrate, an insulating layer disposed on a surface of the cathode opposite the substrate, and a gate electrode disposed on a surface of the insulating layer opposite the cathode; forming at least one emitter hole that exposes the cathode by patterning the insulating layer and the gate electrode; coating a photoresist on the entire exposed surface of a stacked structure that comprises the cathode, the insulating layer, and the gate electrode; removing the portion of the photoresist coated on the portion of the cathode in the emitter hole; maintaining the temperature of the substrate at 200 to 450° C.; preparing an organic-metal compound that includes Ni; forming an organic-metal compound vapor by vaporizing the organic-metal compound; forming carbon fibers in the emitter hole on the cathode by facilitating a chemical reaction between the organic-metal compound vapor and a reaction gas containing ozone in the emitter hole; and removing the photoresist from the stacked structure.

The organic-metal compound may be one material selected from the group consisting of $Ni(C_5H_5)_2$, $Ni(CH_3C_5H_4)$, $Ni(C_5H_7O_2)_2$, $Ni(C_{11}H_{19}O_2)_2$, $Ni(C_7H_{16}NO)$, and $Ni(C_7H_{17}NO)_2$. The organic-metal compound may also be provided as a solution comprising n-heptane as a solvent. The concentration of the organic-metal compound in the n-heptane is 0.05 to 0.5M. The vaporization temperature of the organic-metal compound may be maintained 140 and 200° C. Ozone may be supplied at a flow rate of 150 g/m³ or greater. The carbon fibers may be grown vertically. The substrate may be a glass substrate, a sapphire substrate, a plastic substrate, or a silicon substrate.

In another embodiment, carbon fibers may be grown in a low temperature process, that is, at a temperature of 200 to 450° C.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
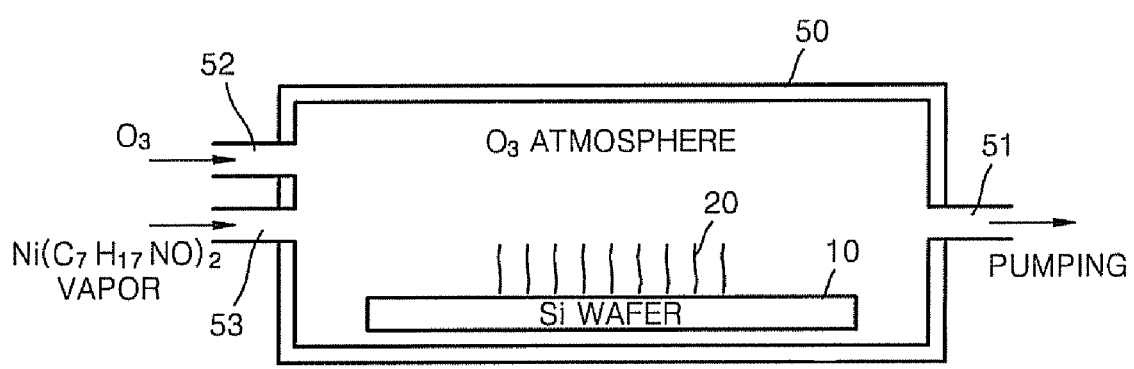
FIG. 1 is a schematic drawing illustrating a process of forming carbon fibers according to an embodiment of the present invention.

The present invention will now be described more fully with reference to the accompanying drawings in which exemplary embodiments of the invention are shown. In the drawings, the thicknesses of layers and regions are exaggerated for clarity.

It will be understood that when an element is referred to as being "on" another element, it can be directly on the other element or intervening elements may be present therebetween. In contrast, when an element is referred to as being "disposed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2A:
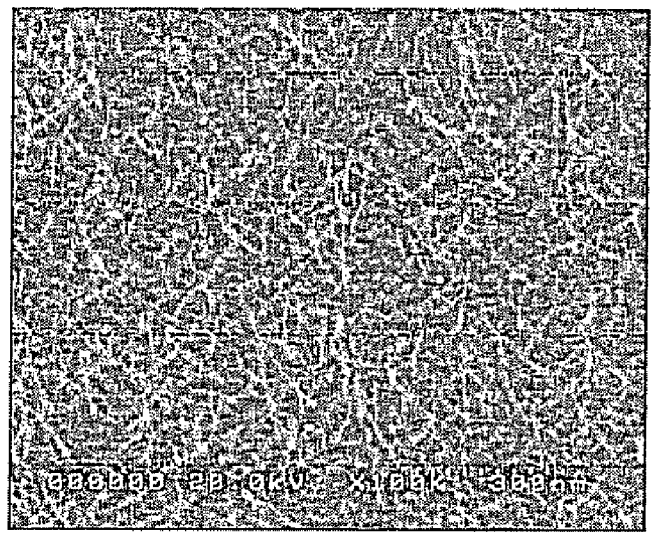
FIGS. 2A and 2B are respectively a scanning electron microscope (SEM) image and a cross-sectional view of carbon fibers grown on a substrate using the process of forming carbon fibers of FIG. 1.
Figure 2B:
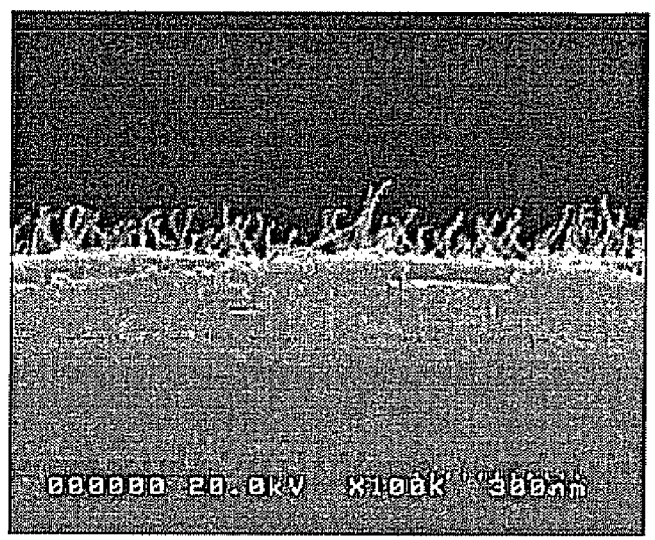
Figure 3:
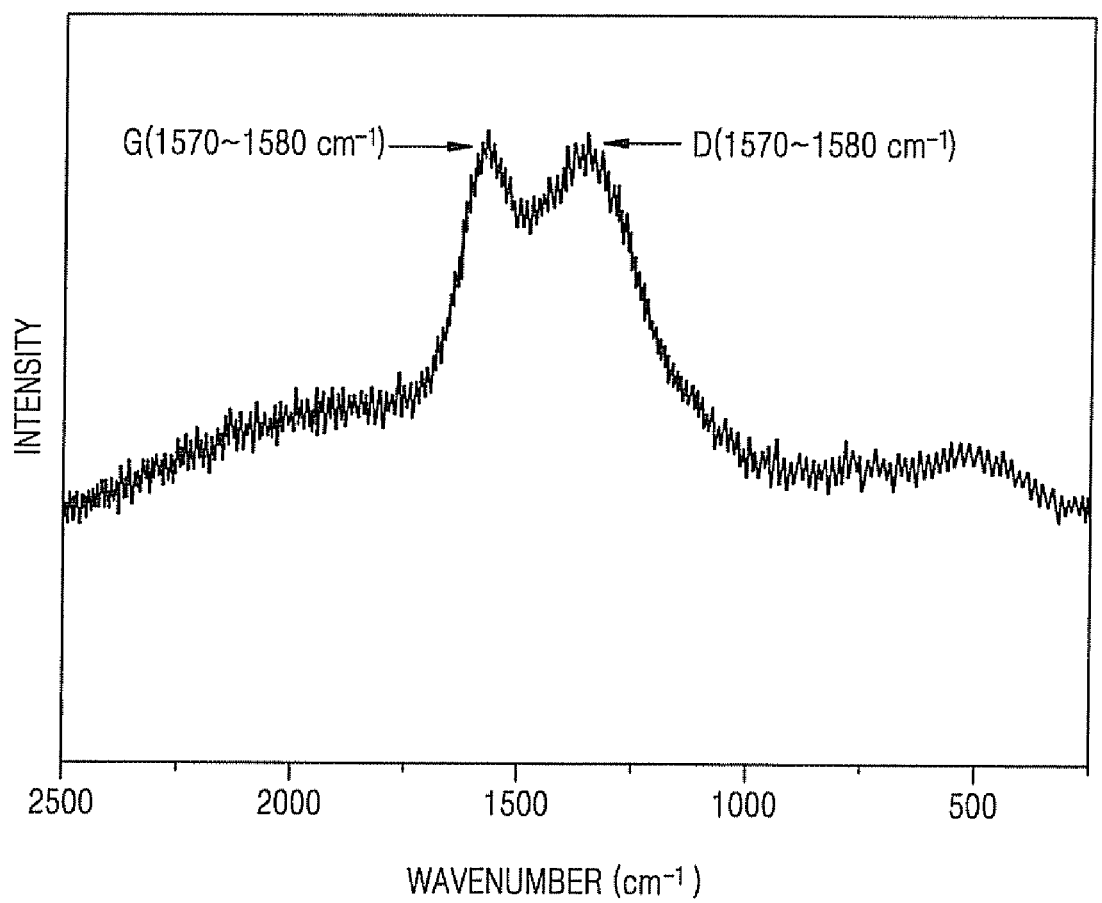
FIG. 3 is a Raman spectrum of the carbon fibers shown in FIG. 2.

FIG. 1 is a schematic drawing illustrating a process of forming carbon fibers according to an embodiment of the present invention. FIGS. 2A and 2B are respectively a scanning electron microscope ("SEM") image and a cross-sectional view of carbon fibers grown on a substrate using the process of forming carbon fibers of FIG. 1. FIG. 3 is a Raman spectrum of the carbon fibers shown in FIG. 2.

Referring to FIG. 1, after loading a substrate 10 in a reaction chamber 50, the substrate 10 is heated. The reaction chamber 30 can be evacuated by pumping gases out of an exhaust port 51, and reactant gases can similarly be introduced to the reaction chamber by one or more inlet ports (e.g., inlet ports 52 and 53). The substrate 10 is maintained at a temperature of 200 to 450° C., preferably, at 350° C. The material constituting the substrate 10 is not specifically limited. The substrate 10 can be, for example, a glass substrate, a sapphire substrate, a plastic substrate, or a silicon substrate.

An organic-metal compound that includes Ni is prepared. Then, an organic-metal compound vapor is formed by vaporizing the organic-metal compound. In an exemplary embodiment, the organic-metal compound can be Nickel 1-dimethlamino-2-methyl-2-butanolate (also abbreviated as both Ni(dmamb)$_2$ and as Ni(C$_7$H$_{17}$NO)$_2$), where the ligand is an alkoxide ligand derived from 1-dimethylamino-2-methyl-2-butanol. In an embodiment, the organic-metal compound can be selected from the group consisting of Ni(C$_5$H$_5$)$_2$, Ni(CH$_3$C$_5$H$_4$), Ni(C$_5$H$_7$O$_2$)$_2$, Ni(C$_{11}$H$_{19}$O$_2$)$_2$, Ni(C$_7$H$_{16}$NO), and Ni(C$_7$H$_{17}$NO)$_2$. In an embodiment of the present invention, the organic-metal compound can be provided as a solution comprising n-heptane as a solvent. In this case, the concentration of the organic-metal compound in n-heptane is maintained at 0.05 to 0.5M. The vaporization temperature of the organic-metal compound is maintained at 140 to 200° C., specifically at about 180° C.

Next, a chemical reaction is facilitated by supplying the organic-metal compound vapor by an inlet port (e.g., inlet port 53, shown in the figure as providing Ni(C$_7$H$_{17}$NO)$_2$ vapor) and a reaction gas containing ozone (O$_3$) (e.g., inlet ports 52, shown in the figure as providing the ozone) to grow carbon fibers 20 on the substrate 10. Ozone may be supplied at a flow rate of 150 g/m$^3$ or more to ensure a sufficient chemical reaction with the organic-metal compound vapor.

As depicted in FIGS. 1, 2A, and 2B, carbon fibers 20 can be vertically grown on the substrate 10 using the process described above. By analyzing the Raman spectrum of FIG. 3, a G-band (correlating to the helical chirality of the arrangement of 6 membered rings in the nanotube) and a D-band (correlating to the diameter of the nanotube) can be confirmed in the carbon fibers 20 formed according to the process described above.

According to an embodiment of the present invention, the carbon fibers can be grown at a low temperature of 200 to 450° C. The organic-metal compound used for a source material in manufacturing the carbon fibers according to an embodiment of the present invention readily dissolves at a relatively low temperature, i.e., below 450° C., thereby enabling a reduction of the carbon fiber growing temperature. In particular, since the organic-metal compound contains Ni, which is a catalyst material suitable for growing carbon fibers at a low temperature, the Ni can serve as a catalyst when the organic-metal compound dissolves, and a ligand material, which is combined with the Ni metal, can be used as a carbon source. As a result, in the method of forming carbon fibers according to an embodiment, the carbon source and the Ni catalyst are provided simultaneously by supplying only the organic-metal compound. Accordingly, in embodiments, a catalyst material deposition process can be omitted, that is, the method of forming carbon fibers is simpler than a conventional 2-step process that includes a catalyst material deposition process and a carbon source supplying process.

Embodiment-Forming Carbon Fibers

A 0.1 to 0.2 M Ni(C$_7$H$_{17}$NO)$_2$ solution was prepared as a source material (organic-metal compound) by dissolving Ni(C$_7$H$_{17}$NO)$_2$ in n-heptane. Then, carbon fibers having a diameter of a few tens of nm were grown by reacting ozone with the source material using a CVD method.

The temperature of the substrate was adjusted to 250 to 350° C., and the organic-metal source material was supplied to a reactor after evaporation using an evaporator. The evaporator was maintained at a temperature of about 180° C., and the organic-metal source material was supplied onto the substrate using a shower-head method. After the organic-metal source material was supplied onto the substrate, ozone was supplied to the reactor as a reaction gas. Through the processes described above, while the organic-metal source material (organic-metal compound) was dissolving, carbon fibers were synthesized using Ni as a catalyst and a ligand as a carbon source. The growth of the carbon fibers was closely related to the amount of ozone supplied. That is, when the ozone flow rate was greater than 150 g/m$^3$, the carbon fibers grew well. In the present experiment, the time required to grow the carbon fibers was approximately 10 minutes, and a Si substrate was used.

Since the carbon fibers formed in this way are emitters, i.e., carbon fibers that emit electrons according to a voltage applied thereto, the process of forming the carbon fibers can be used for manufacturing a field emission device.

Hereinafter, a method of manufacturing a field emission device will now be described with reference to the accompanying drawings.

FIGS. 4A through 4I are cross-sectional views illustrating a method of forming carbon fibers according to an embodiment of the present invention. In the method of forming carbon fibers, parts that have described above will not be repeated.

Figure 4A:
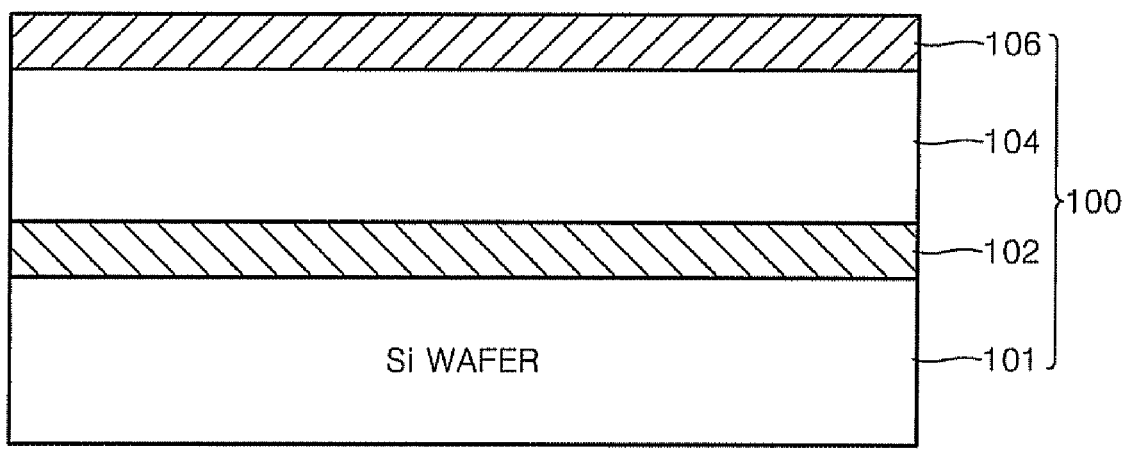
FIGS. 4A through 4I are cross-sectional views illustrating a method of forming carbon fibers according to an embodiment of the present invention.
Figure 4B:
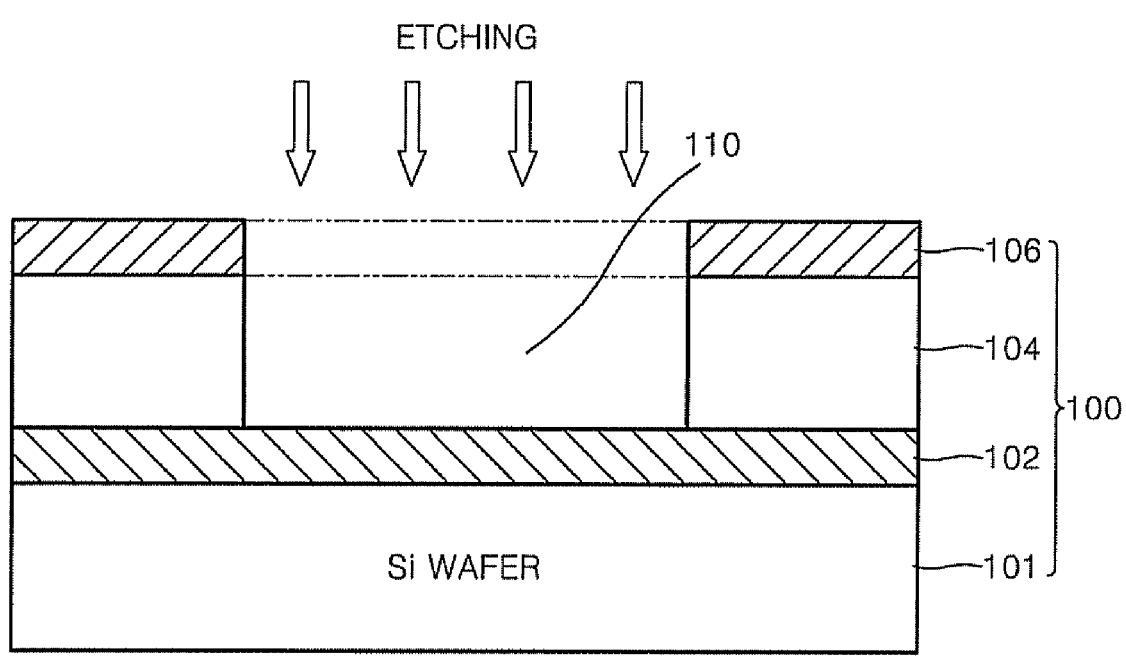
Figure 4C:
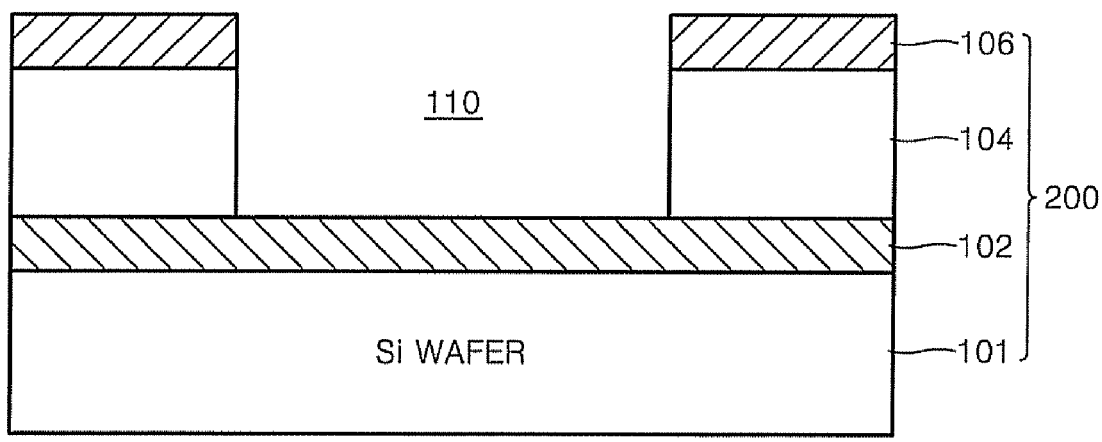

Referring to FIGS. 4A through 4C, after providing a substrate 101, a stacked structure 100 is formed, in which a cathode 102 is disposed on a surface of the substrate 101, an insulating layer 104 is disposed on a surface of the cathode 102 opposite the substrate 101, and a gate electrode 106 is disposed on a surface of the cathode 102 opposite the insulating layer 104, and in which the above layers are formed sequentially. Afterward, at least one emitter hole 110 that exposes the cathode 102 is formed by etching/patterning a predetermined region of the insulating layer 104 and the gate electrode 106 (FIG. 4B) to form an etched, stacked structure 200 (FIG. 4C).

The material constituting the substrate 101 is not specifically limited. The substrate 101 can be, for example, a glass substrate, a sapphire substrate, a plastic substrate, or a silicon substrate. The cathode 102 and the gate electrode 106 can be formed of a conductive material, for example, a metal such as Al, Ag, Cu, etc., or a conductive oxide such as indium tin oxide (ITO). The insulating layer 104 can be formed of an insulating material such as $SiO_2$. Also, each of the cathode 102, the insulating layer 104, and the gate electrode 106 can be formed using a thin film deposition method known to those skilled in the art, for example, physical vapor deposition (PVD) such as sputtering, thermal evaporation, or chemical vapor deposition (CVD), and thus, a description thereof will be omitted.

Figure 4D:
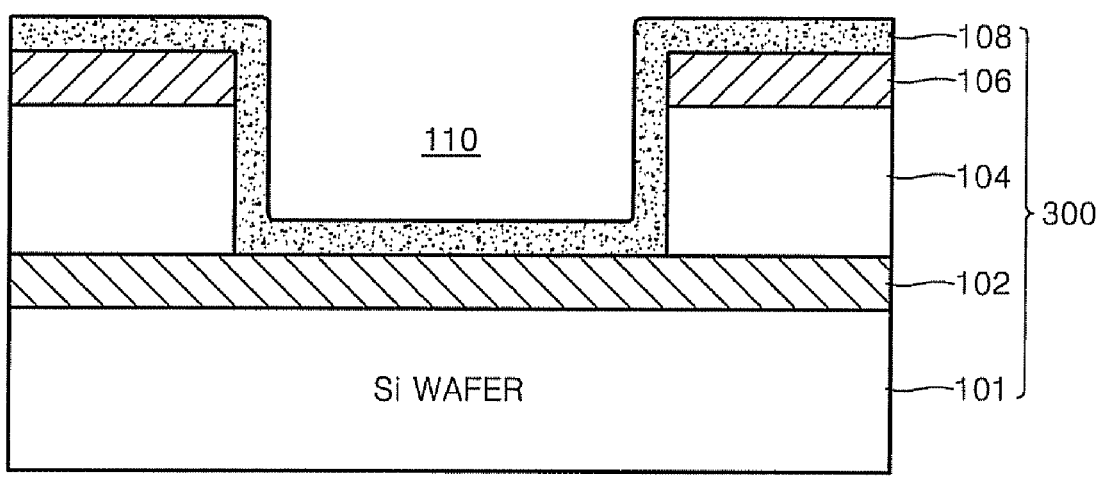
Figure 4E:
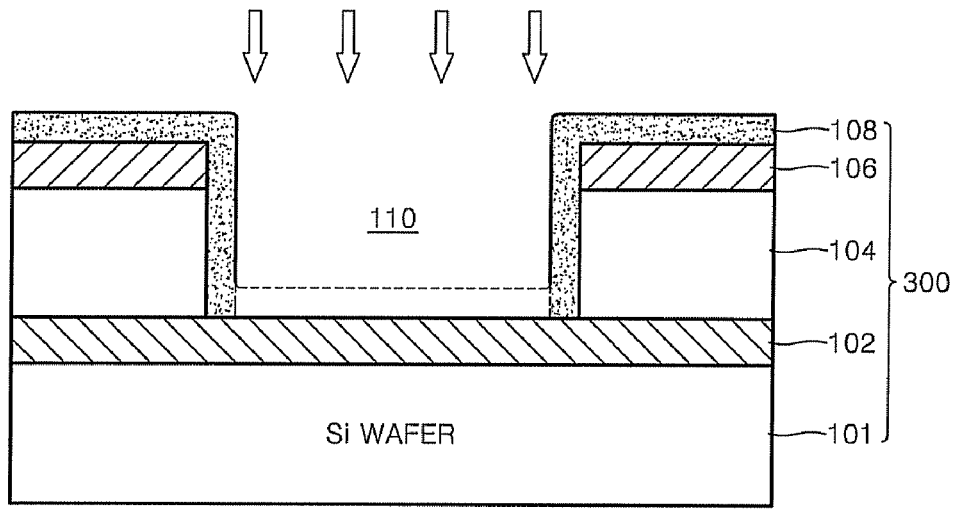
Figure 4F:
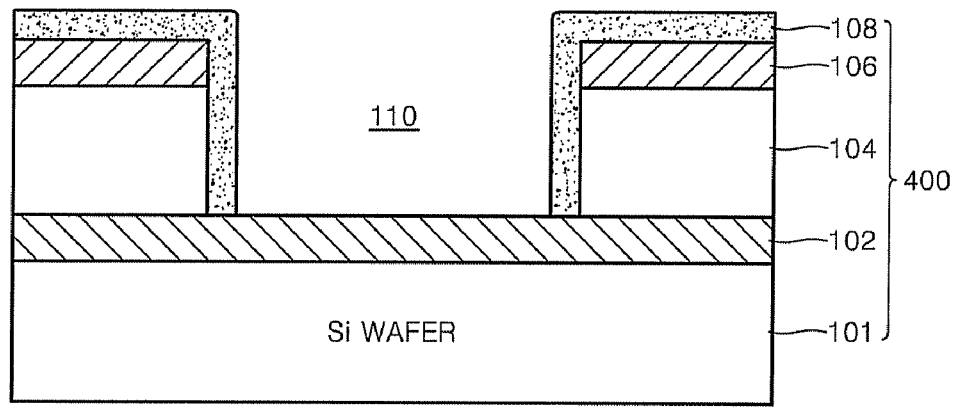

Referring to FIG. 4D, a photoresist 108 is coated on the entire exposed surface of the etched stacked structure 200 (from FIG. 4C) to provide a coated, etched stacked structure 300 including the cathode 102, the insulating layer 104, and the gate electrode 106. Then, referring to FIGS. 4E and 4F, the portion of the cathode 102 in the emitter hole 110 is exposed by selectively exposing/developing the portion of the photoresist 108 coated on the cathode 102 (FIG. 4E). In embodiment, to selectively remove a portion of the photoresist 108, an exposure process, a developing process, and an etching process can be sequentially performed. After the selective removal of the photoresist, an imaged, etched stacked structure 400 is obtained (FIG. 4F).

Figure 4G:
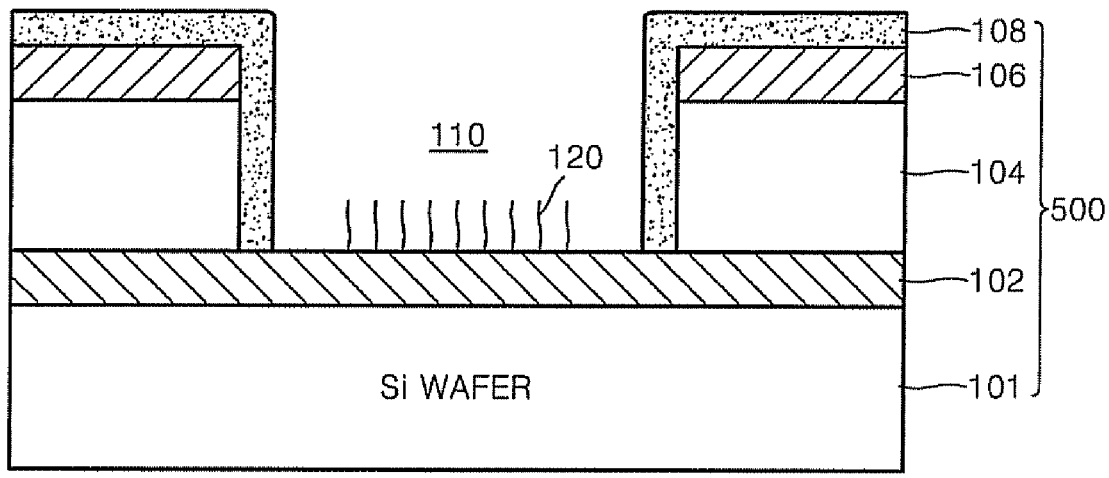
Figure 4H:
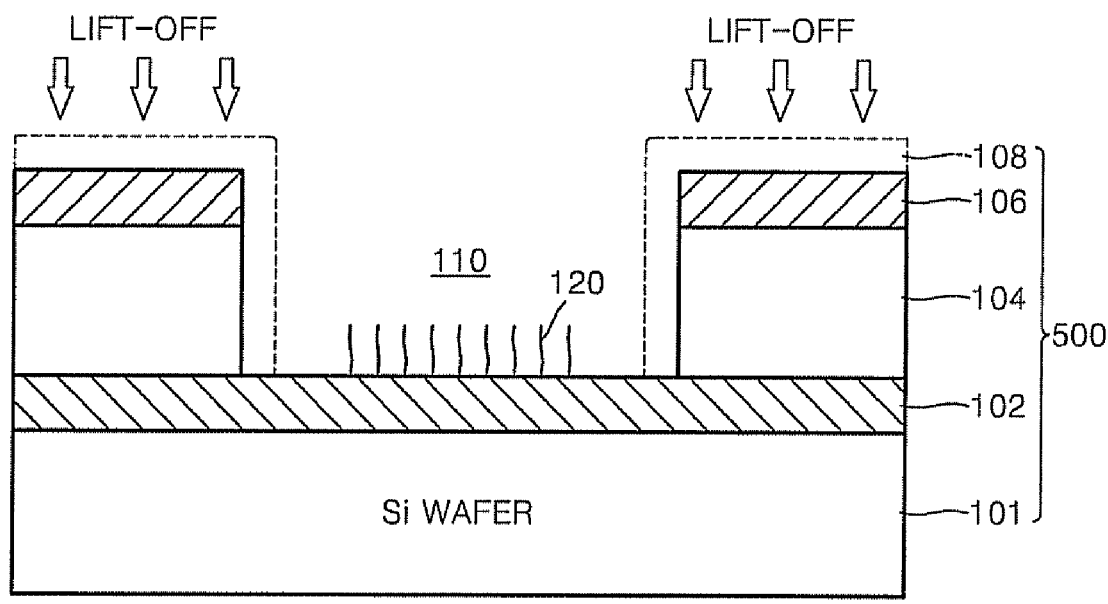

Referring to FIG. 4G, the substrate 101 is heated and maintained at a temperature of 200 to 450° C., and then an organic-metal compound vapor and a reaction gas containing ozone are supplied to the emitter hole 110 to facilitate a chemical reaction therebetween. Thus, carbon fibers 120 are grown on the cathode 102 in the emitter hole 110 to provide carbon fiber intermediate structure 500. The carbon fibers 120 can further be formed on the photoresist 108. The carbon fibers 120 grown on the photoresist 108 can be removed together with the photoresist 108 in a subsequent "lift-off" process (FIG. 4H). The method of growing the carbon fibers 120 has described in detail above, and said description will not be repeated.

Figure 4I:
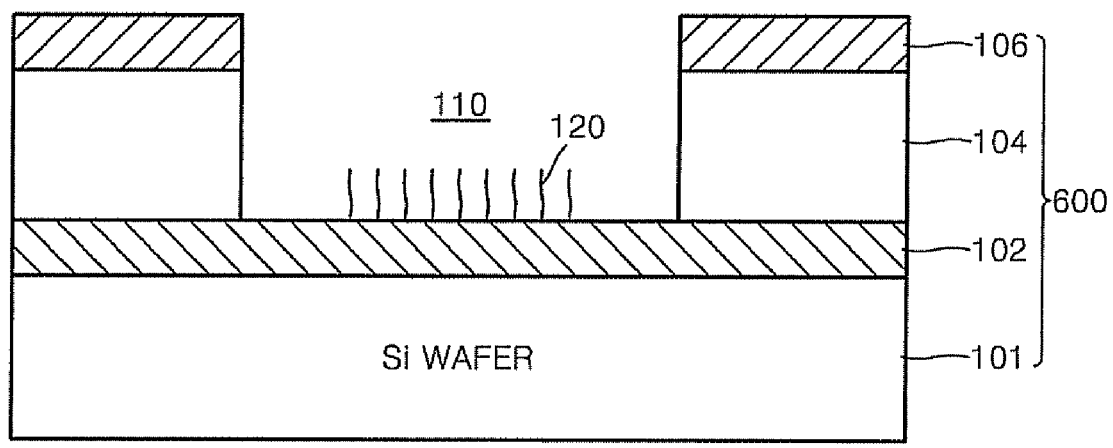

Referring to FIG. 4I, when the photoresist 108 remaining on the stacking structure is etched, a field emission display (FED) 600 as depicted in FIG. 4I can be realized. The above carbon fiber growing process is a one-step process, and the carbon fibers 120 are readily formed in the emitter hole 110. Therefore, the FED can be formed through a simple and easy process, thereby reducing manufacturing costs.

According to an embodiment, carbon fibers can be grown in a low temperature process using an organic-metal chemical vapor deposition method in which the temperature is maintained at 200 to 450° C. In the method of forming carbon fibers according to the present invention, an organic-metal compound used for a source material decomposes at a relatively low temperature, i.e., 450° C. or less, which is advantageous for reducing the carbon fiber growing temperature. Particularly, since the organic-metal compound contains Ni, which is a catalyst required for growing the carbon fibers, when the organic-metal compound decomposes, Ni acts as a catalyst and the ligand material that has combined with Ni is used as a carbon source material. As a result, in the method of forming carbon fibers, the carbon source and the Ni catalyst are supplied simultaneously by supplying only the organic-metal compound. Accordingly, in the present invention, a catalyst material deposition process can be omitted, that is, the method of forming carbon fibers is simpler than a conventional 2-step process that includes a catalyst material deposition process and a subsequent carbon source supplying process.

Also, since the carbon fibers formed in this way are emitters, i.e., are carbon fibers that emit electrons according to a voltage applied thereto, the process of forming the carbon fibers can be used for manufacturing a FED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming carbon fibers comprising:
    heating a substrate and maintaining the substrate at a temperature of 200 to 450° C. after loading the substrate into a reaction chamber;
    preparing an organic-metal compound containing Ni;
    forming an organic-metal compound vapor by vaporizing the organic-metal compound; and
    forming carbon fibers on the substrate by facilitating a chemical reaction between the organic-metal compound vapor and a reaction gas containing ozone in the reaction chamber.

2. The method of claim 1, wherein the organic-metal compound is a material selected from the group consisting of $Ni(C_5H_5)_2$, $Ni(CH_3C_5H_4)$, $Ni(C_5H_7O_2)_2$, $Ni(C_{11}H_{19}O_2)_2$, $Ni(C_7H_{16}NO)$, and $Ni(C_7H_{17}NO)_2$.

3. The method of claim 2, wherein the organic-metal compound is provided as a solution comprising n-heptane as a solvent.

4. The method of claim 3, wherein the concentration of the organic-metal compound in n-heptane is 0.05 to 0.5M.

5. The method of claim 4, wherein the vaporization temperature of the organic-metal compound is maintained at 140 to 200° C.

6. The method of claim 1, wherein ozone is supplied at a flow rate of 150 g/m³ or greater.

7. The method of claim 1, wherein the carbon fibers are grown vertically.

8. The method of claim 1, wherein the substrate is a glass substrate, a sapphire substrate, a plastic substrate, or a silicon substrate.

9. A method of manufacturing a field emission device, comprising:
    providing a substrate;
    sequentially forming a stacked structure comprising a cathode disposed on a surface of the substrate, an insulating layer disposed on a surface of the cathode opposite the substrate, and a gate electrode disposed on a surface of the insulating layer opposite the cathode;
    forming at least one emitter hole that exposes the cathode by patterning the insulating layer and the gate electrode;
    coating a photoresist on the entire exposed surface of the stacked structure comprising the cathode, the insulating layer, and the gate electrode;
    removing the portion of the photoresist coated on the portion of the cathode in the emitter hole;
    maintaining the temperature of the substrate at 200 to 450° C.;
    preparing an organic-metal compound that includes Ni;
    forming an organic-metal compound vapor by vaporizing the organic-metal compound;

forming carbon fibers in the emitter hole on the cathode by facilitating a chemical reaction between the organic-metal compound vapor and a reaction gas containing ozone in the emitter hole; and removing the photoresist from the stacked structure.

10. The method of claim 9, wherein the organic-metal compound is a material selected from the group consisting of $Ni(C_5H_5)_2$, $Ni(CH_3C_5H_4)$, $Ni(C_5H_7O_2)_2$, $Ni(C_{11}H_{19}O_2)_2$, $Ni(C_7H_{16}NO)$, and $Ni(C_7H_{17}NO)_2$.

11. The method of claim 10, wherein the organic-metal compound is provided as a solution comprising n-heptane as a solvent.

12. The method of claim 11, wherein the concentration of the organic-metal compound in the n-heptane is 0.05 to 0.5M.

13. The method of claim 12, wherein the vaporization temperature of the organic-metal compound is maintained at 140 and 200° C.

14. The method of claim 9, wherein ozone is supplied at a flow rate of 150 $g/m^3$ or greater.

15. The method of claim 9, wherein the carbon fibers are grown vertically.

16. The method of claim 9, wherein the substrate is a glass substrate, a sapphire substrate, a plastic substrate, or a silicon substrate.

* * * * *